United States Patent
Bellingrath et al.

(10) Patent No.: US 7,295,236 B1
(45) Date of Patent: Nov. 13, 2007

(54) CIRCUIT FOR PROCESSING A TIME-DISCRETE ANALOG SIGNAL AND IMAGE SENSOR

(75) Inventors: Thomas Bellingrath, Nuremberg (DE); Michael Hackner, Erlangen (DE)

(73) Assignee: Fraunhofer-Gesellschaft zue Foerderung der angewandten Forschung e.V., Munich (DE)

(*) Notice: Subject to any disclaimer, the term of this patent is extended or adjusted under 35 U.S.C. 154(b) by 0 days.

(21) Appl. No.: 09/958,870

(22) PCT Filed: Mar. 30, 2000

(86) PCT No.: PCT/EP00/02834

§ 371 (c)(1),
(2), (4) Date: Feb. 13, 2002

(87) PCT Pub. No.: WO00/64142

PCT Pub. Date: Oct. 26, 2000

(30) Foreign Application Priority Data

Apr. 20, 1999 (DE) ................................ 199 17 863

(51) Int. Cl.
 *H04N 3/14* (2006.01)
 *H04N 5/335* (2006.01)
(52) U.S. Cl. ....................... 348/302; 348/308
(58) Field of Classification Search .............. None
See application file for complete search history.

(56) References Cited

U.S. PATENT DOCUMENTS

| | | |
|---|---|---|
| 5,541,553 A | 7/1996 | Chujo |
| 5,869,857 A | 2/1999 | Chen |
| 6,043,525 A * | 3/2000 | Chen ......................... 257/292 |
| 6,157,016 A * | 12/2000 | Clark et al. .............. 250/208.1 |

FOREIGN PATENT DOCUMENTS

| | | |
|---|---|---|
| EP | 0952730 | 10/1999 |
| JP | 62-220010 | 9/1987 |
| JP | 07245536 | 9/1995 |

* cited by examiner

*Primary Examiner*—Vivek Srivastava
*Assistant Examiner*—Yogesh K. Aggarwal
(74) *Attorney, Agent, or Firm*—Michael A. Glenn; Glenn Patent Group

(57) ABSTRACT

A circuit for processing an analog signal having a time sequence of discrete signal levels, each of which lies in a time interval and represents an information-bearing segment of the interval while the rest of the time interval is a non-information-bearing segment, comprises a transistor (10) in emitter-follower or source-follower configuration, a high emitter or source resistance or, instead, a high-ohm constant current source (20), and a device (14) for applying a voltage supply, as well as a switch (24) which is connected between the emitter and a reference potential (26) to prevent a current from flowing via the high-ohm resistance or the high-ohm voltage source (20) for charge reversal of an output capacitance (22) of the circuit in one direction, whereas for charge reversal in the other direction the dynamic current boosting effect of the transistor (10) is exploited. This results in a fast emitter-follower or source-follower circuit which is particularly suitable as the output stage for image sensors.

9 Claims, 5 Drawing Sheets

CIRCUIT FOR PROCESSING A TIME-DISCRETE ANALOG SIGNAL AND IMAGE SENSOR

The present invention relates generally to the processing of analog signals and in particular to the processing of time-discrete analog signals such as those which appear at the out-put of an image sensor with a plurality of pixel cells.

There are many applications in which analog signals must be processed rapidly and with high precision. As a general principle it can be stated that the minimum time that the output of an amplifier stage requires to reach a voltage value with a specified degree of accuracy depends on the load capacitance at the output and on the current available for reversing the charge of this load capacitance.

In the prior art the primary means of achieving a fast amplifier is to minimize the load capacitance of the amplifier stage, which often consists of parasitic capacitances and line capacitances. In addition, the maximum output current of the driving stage which is needed for charge reversal of the load capacitance is increased by means of either a constant or signal-dependent increase in the cross current, i.e. of the dc current for a particular operating point, through the output stage.

However, these measures are not unproblematic. Minimization of the load capacitance is often limited due to specification requirements or due to the physical arrangement of the circuit elements and the accompanying line capacitance. Also, increasing the maximum possible output current through a constant increase in the cross current is also limited due to the accompanying increase in the power loss. Furthermore, a signal-dependent increase in the cross current necessitates special circuit measures, which often entail other restrictions. In the case of a pair of push-pull source followers or push-pull emitter followers, in which the respective complementary transistor serves as the load for the other, the output modulation of the whole circuit decreases. Other measures for a signal-dependent increase in the cross current involve more complicated circuitry and may adversely affect the bandwidth and temperature stability of the circuit.

Time-discrete analog signals are special analog signals which have an essentially constant level in any one interval, this level theoretically jumping immediately to another constant level in the following interval. When such time-discrete analog signals are processed by real circuits having an inherently low-pass characteristic, the theoretically infinitely steep flanks at the interval boundaries become flatter and the time-discrete signal level of an interval is not already attained at the boundary of the interval but only after a certain "stabilization time". Only after the level has been attained is the time-discrete analog signal meaningful, which is why this segment of the interval is designated the information-bearing segment of the time-discrete analog signal.

Image sensors which are read out serially supply such a time-discrete analog signal, for example. For instance in the case of an image sensor with a row of 512 pixels, the 512 pixels are read out in sequence, under the control of a clock signal, resulting in a time-discrete analog signal at the output of the image sensor which represents an illumination value of the first pixel in its first interval and an illumination value of the $512^{th}$ pixel in its last interval. Obviously such a sensor could have a plurality of outputs and the readout, instead of being completely serial could be a mixture of serial and parallel. It can, however, be assumed that an image sensor will generally have fewer analog outputs than image points. This means that the analog values of a plurality of image points must be transmitted at the highest possible rate via the outputs of the image sensor using a multiplexing method. This results in the described time-discrete analog signal, which can also be viewed as a continuous signal composed of stepwise constant signal parts.

Normally conventional amplifier circuits, such as continuously operated source-follower or emitter-follower circuits, are employed to process such time-discrete analog signals or to drive an external and/or internal load capacitance. Such source-follower or emitter-follower amplifier stages are based on transistors with a signal-dependent dynamic operating point (AB operation). A disadvantage of such a continuously operated source follower or emitter follower is the fact that the magnitude of the output current for an output current direction is limited by the "predetermined" cross current, i.e. in AB operation by the cross current predetermined by the signal, through the transistor stage. If the specified cross current were simply to be increased, so as to make the stage faster, the power loss of the amplifier stage would become unacceptably high.

JP 62-220010 discloses a circuit for selectively lowering the base potential of a second transistor whose base is connected to an output node of a first transistor. Between the output node of the first transistor and a ground potential there is a current source. The first transistor, an npn transistor, has its emitter terminal connected to the output node and its collector terminal to a battery voltage, and an input potential can be applied to its base terminal.

JP-07245536-A discloses an amplifier circuit with an output control function which employs an inverted Darlington circuit. The Darlington circuit consists of a first transistor and a second transistor, the emitter terminal of the first transistor being connected to the collector terminal of the second transistor via a switch. Furthermore, the collector terminal of the first transistor is connected via a voltage supply, which is in turn connected to the emitter terminal of the second transistor. The input terminal of the circuit is formed by the base terminal of the first transistor while the output terminal of the circuit is formed by the collector terminal of the second transistor.

It is the object of the present invention to provide a circuit for processing a time-discrete analog signal which achieves high speed despite the simplicity of the means.

This object is achieved by a circuit according to claim 1 or claim 2.

A further object of the present invention is to provide a fast image sensor.

This object is achieved by an image sensor according to claim 17 or 18.

The present invention is based on the finding that fast stabilization of an amplifier stage to a particular voltage value depends not just on the size of the load capacitance and on the current available for charge reversal of this load capacitance but also on the initial value of the output voltage at the start of the stabilization process. To achieve a fast amplifier stage according to the present invention, therefore, the initial value of the output voltage at the start of the stabilization process is manipulated so as minimize the time amplifier stages need to stabilize to an output voltage value to a specified degree of precision.

As has already been mentioned, the aim is to keep the cross current of an emitter/source-follower stage as low as possible so that the power loss of the transistor remains at an acceptable level. This can be achieved by providing a high-ohm resistor between the emitter or the source and ground (npn emitter follower or n-channel FET) or between emitter terminal or source terminal and operating voltage potential (pnp emitter follower or p-channel FET). A still better arrangement is to replace this resistor with a very high-ohm constant-current source, since the high voltage drop which would be present at the high-ohm emitter resistor no longer occurs. This measure is provided to keep the power loss in the transistor, which rises with increasing collector current or drain current, to a low value.

A disadvantage now, however, is that a load capacitance must discharge or charge up via the high-ohm resistor or the load current source with high internal resistance. This discharging or charging process can therefore only take place very slowly, which has a decisive effect on the speed of the amplifier stage. On the other hand the charging of the capacitance for an npn emitter follower or an n-channel source follower and the discharging for a pnp emitter follower or p-channel source follower takes place quickly since the capacitance is charged or discharged by the voltage supply source. Furthermore, since the input voltage is less than the output voltage during charging, the transistor is automatically turned on so that the transistor is biased into conduction. As a result the transistor supplies a higher output current than that determined by the load current source or the emitter resistor or source resistance.

According to the present invention this dynamic increase in the current, which speeds up the charge reversal of a load capacitance in one direction, is exploited. According to the present invention a switch is also provided which connects the output node of the circuit according to the present invention, which node corresponds to the emitter or the source in one embodiment, preferably at the end and/or at the start of each interval, e.g. from the end of the preceding interval until the start of the following interval, to a reference node so as to discharge the load capacitance (npn emitter follower or n-channel source follower) or to charge it (pnp emitter follower or p-channel source follower) in such a way that all the charge reversal processes for the capacitance due to the time-discrete analog signal take place as a result of the previously described fast effects and there is no need for any charge reversal of the load capacitance via a high-ohm resistor or a high-ohm current source.

Put simply, the charge on the load capacitance at the output node of the circuit is "reset" to a reference potential in a non-information-bearing segment of each interval, i.e. is set to a defined favourable starting value from which the fast charge reversal effect can take place.

In a preferred embodiment of the present invention an npn emitter follower or an n-channel source follower is employed. In this case the reference potential is smaller than or equal to the smallest voltage level of the time-discrete analog signal. In another preferred embodiment of the present invention a pnp emitter follower or a p-channel source follower is employed. In this case the reference potential is greater than or equal to the largest signal level of the analog signal. As a result the charge reversal processes of the load capacitance or of the output node of the transistor stage which are caused by the time-discrete analog signal at the input of the follower stage are always the fast charge reversal processes, which are accelerated by an automatic biasing into conduction of the transistor. This is so since the output voltage of the transistor stage is set to the reference potential through short-circuiting via the switch in a non-information-bearing segment of each interval.

In a preferred embodiment of the present invention a second switch is also provided between the collector terminal or drain terminal of the respective transistor and a node to which a supply potential is applied, or between the emitter terminal or source terminal and the other node, to which the other supply voltage potential is applied, this switch being actuated substantially in synchronism with the first switch so as to "unclamp" the voltage supply of the transistor during the time interval in which the output is short-circuited with the reference potential, thus preventing high cross currents flowing through the transistor during this time and thus keeping the power loss to a low value.

Preferred embodiments of the present invention are described in detail below making reference to the drawings, in which FIG. 1 shows a circuit according to a first embodiment of the present invention which is implemented as an npn emitter follower;

Figure 1:
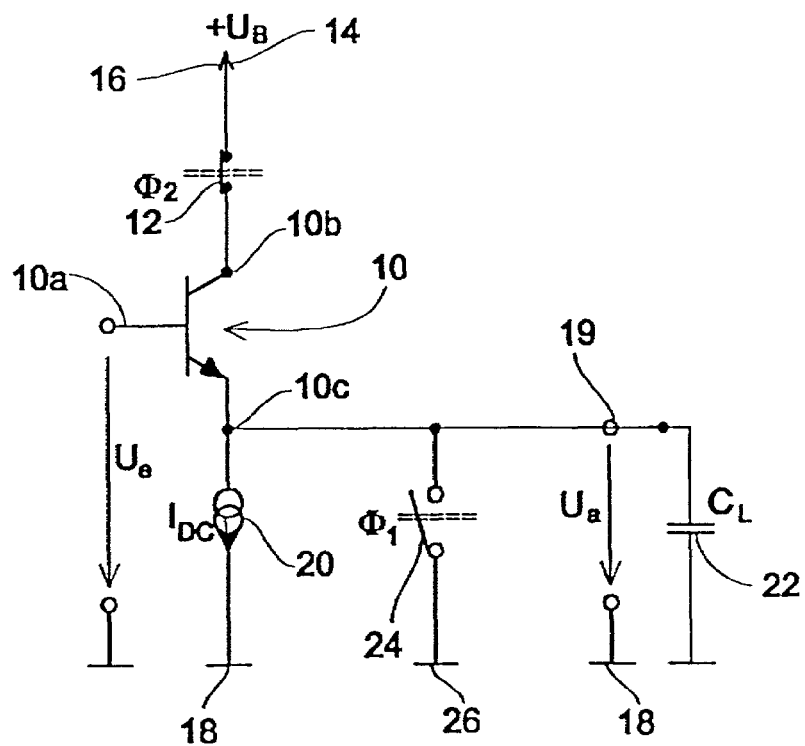

FIG. 1 shows a circuit for processing an analog signal $U_e$ having a time sequence of discrete voltage levels and which, for the purposes of the present invention, will be described as a time-discrete analog signal. The time-discrete analog signal comprises a plurality of time intervals, each of which has a discrete signal level assigned to it which represents an information-bearing segment of the corresponding interval while the rest of the time interval is a non-information-bearing segment. The time-discrete analog signal $U_e$ is applied to an npn transistor (10) and in particular to a first port (10a) of the transistor, which is the base terminal of the transistor (10). A second port (10b) of the transistor, which is the collector terminal of the same, is connected via a switch (12), which will be discussed later, to a device (14) for applying a voltage supply $U_B$.

It should be pointed out here that the term "port" is generally meant to refer to an external transistor inlet which can have a voltage or a current applied to it. For example, if a voltage is applied to the "base port" of a transistor, this means that an output of the voltage source is connected to the base terminal of the transistor, while the other output of the voltage source is connected to a reference node, e.g. the ground node. If a current is applied to the base port, this means that one terminal of a current source is connected to the base terminal of the transistor, while the other output of the current source is connected to a reference node of some kind, e.g. ground.

For an integrated circuit the device (14) will be a protruding voltage supply pin, to which an external voltage supply can be connected. If the chip has an on-chip voltage supply, the device (14) for applying a voltage supply will be an internal line in the chip leading to the internal voltage supply $U_B$. Via the device (14) for applying a voltage it is possible to apply a voltage between a first node (16) and a second node (18). In the first embodiment of the present invention shown in FIG. 1 the first node (16) is at voltage supply potential $+U_B$ while the second node (18) is grounded.

Between a third port (10c) of the transistor (10), the emitter terminal, and the second node (18) (ground in FIG. 1) a load current source $I_{DC}$ (20) is connected, a dc current source which defines the operating point of the transistor (10). An emitter resistor could also be provided instead of the load current source (20). Both the load current source (20) and the emitter resistor can be regarded as a device for supplying a direct current between the emitter terminal (10c) of the transistor (10) and the ground node (18). If a constant current source is used instead of a high-ohm emitter resistor, the high voltage drop at the emitter resistor can be avoided, as is known to persons skilled in the art.

An output node (19) of the circuit shown in FIG. 1 is formed by the emitter terminal (10c) of the transistor (10) and the second node (18), an output voltage $U_a$ existing between these two nodes.

As is well known, the output voltage $U_a$ follows the input voltage $U_e$, the magnitude of the output voltage $U_a$ being approximately equal to the magnitude of the input voltage $U_e$ minus about 0.6 V. For this reason this circuit is also called an emitter follower. Alternatively the emitter follower can also be regarded as an impedance transformer which permits a high-ohm stage to be coupled to a low-ohm stage without voltage loss.

Figure 2:
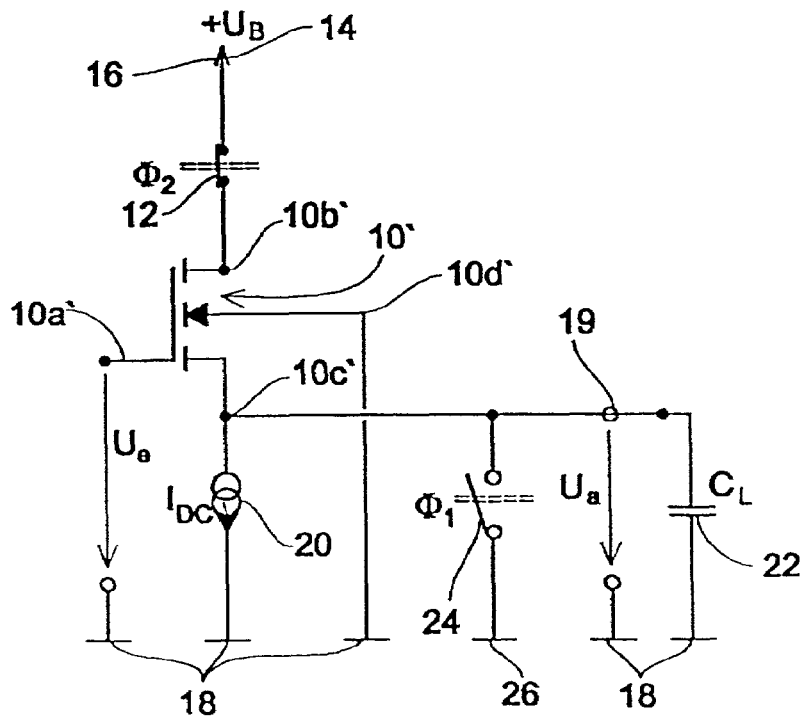
FIG. 2 shows a circuit according to a second embodiment of the present invention which is implemented as an n-channel source follower.
Figure 3:
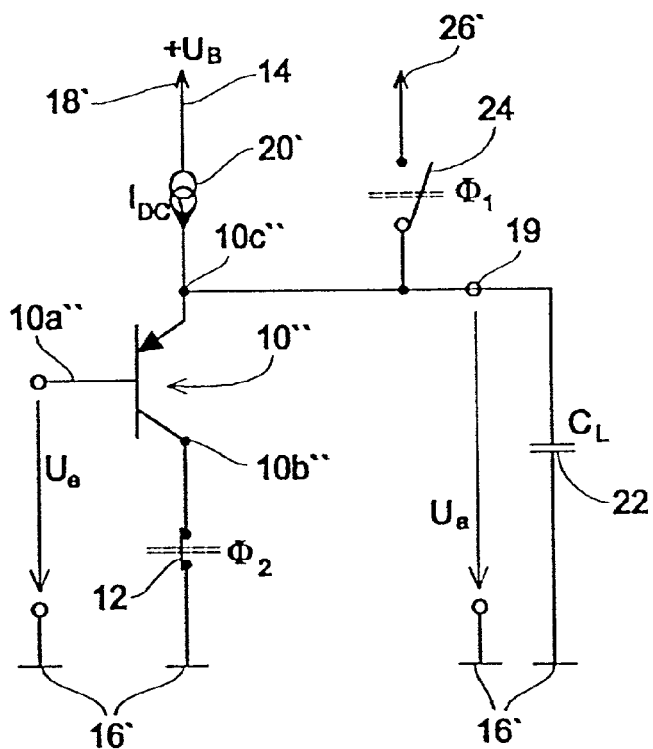
FIG. 3 shows a circuit according to a third embodiment of the present invention which is implemented as a pnp emitter follower.
Figure 4:
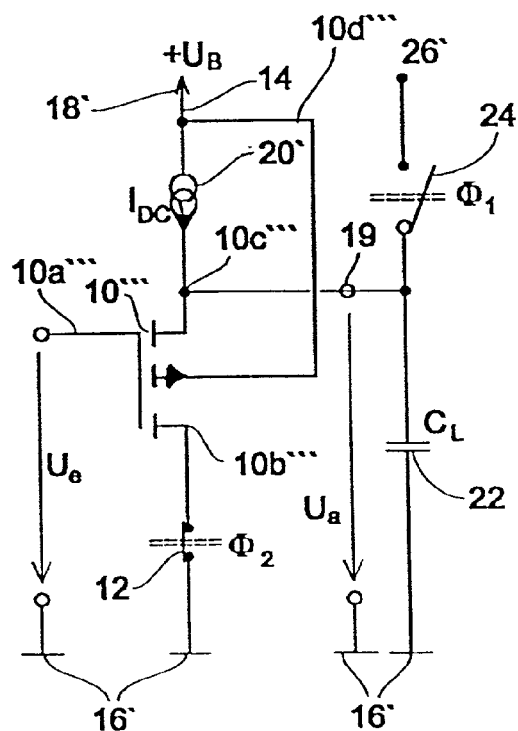
FIG. 4 shows a circuit according to a fourth embodiment of the present invention which is implemented as a p-channel source follower.

Normally the output node (19) of an amplifier stage is capacitively loaded, as is indicated in FIG. 1 and also in FIGS. 2 to 4 by the load capacitance $C_L$. This load capacitance $C_L$ (22) may result from a capacitive impedance of a following circuit or from line capacitances or parasitic capacitances between the output and ground. For the purposes of representation, but without implying any loss of generality, this load capacitance $C_L$ (22) is treated as a concentrated element in the figures.

According to the present invention there is in parallel to the load capacitance (22) a first switch (24) via which the third port (10c), i.e. the emitter terminal, can be short-circuited with a reference potential (26), which in FIG. 1 is the same as the ground potential (18). However, the reference potential (26) could also be e.g. a low-ohm source for discharging the load capacitance (22), e.g. in the form of an operating voltage supply or a loaded capacitance.

Figure 5:
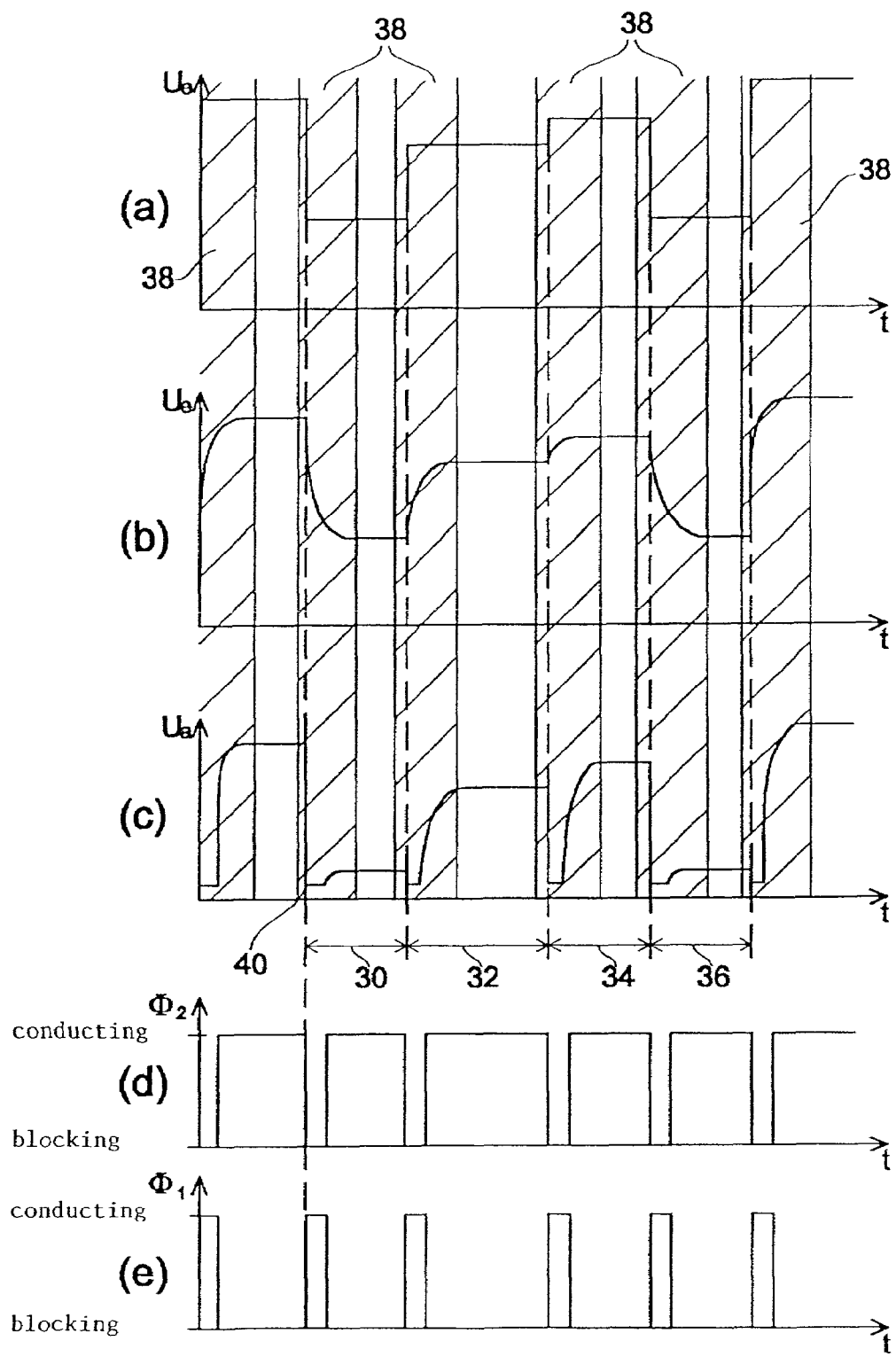
FIG. 5 shows a time diagram for signals which occur in the circuit shown in FIG. 1.

In the following reference is made to FIG. 5 in order to explain the mode of operation of the circuit shown in FIG. 1 according to a first embodiment of the present invention. FIG. 5 (*a*) shows a time-discrete analog signal $U_e$, as obtained e.g. when an image sensor is read out ideally, i.e. without being affected by the low-pass effects always present in real circuits, as a function of time.

To make matters clear, four intervals have been indicated. FIG. 5 (*b*) shows the same time-discrete analog signal as in FIG. 5 (*a*), but here it has been affected by the low-pass effects inherent in real circuits, as a result of which the transitions from one interval to the next are no longer infinitely steep but have a flatter, curved profile. FIG. 5 (*c*) shows the corresponding profile of the output voltage $U_a$ between the output node 19 (FIG. 1) and ground potential 18. The hatched areas (38) in FIGS. 5 (*a*), 5 (*b*) and 5 (*c*) represent the non-information-bearing segments of the signal. As can be seen, these are located around the interval boundaries for which it is known from the start that voltage values occurring there are undetermined since they are subject to transients, as is shown e.g. in FIG. 5 (*b*) for the input voltage $U_e$. For reasons of reliability due to timing tolerances which occur in practice, the areas 38 extend not just from an interval boundary to the right but also from an interval boundary to the left in such a way that the-information-bearing, non-hatched segments remain. These are characterized by the fact that in them the respective signal level of the time-discrete analog signal is essentially constant. Only the information-bearing segments of the intervals 30, 32, 34, 36 are relevant for information evaluation, not, however, the non-information-bearing hatched segments 38 and the hatched segment of an interval preceding the interval 30.

In the following the left edge of the interval 30 is considered. To the left of the left edge of the interval 30 the input signal $U_e$ and therefore also the output signal $U_a$ are at a high level. In the interval 30 the input signal $U_e$ then drops to a low level, which the output signal $U_a$ should also adopt as quickly as possible. This means that the load capacitance $C_L$ 22 in FIG. 1 must discharge to the low level of the output signal $U_a$ in the interval 30. As can be seen from FIG. 1, this discharge can only take place via the high-ohm load current source 20 or a high-ohm emitter resistor which takes its place. The discharge would therefore take place very slowly, which greatly impairs the speed of the emitter-follower stage in the prior art. According to the present invention the switch 24 is now short-circuited in the non-information-bearing segment of the interval 30 so that the charge on the load capacitance 22, which is proportional to the applied voltage $U_a$ from the interval before the interval 30, can flow to the reference potential 26. This discharge takes place very quickly since the switch 24 provides a "short-circuit" connection of much lower ohmic value than that of the load current source. It should be noted that the term "short-circuit" is not to be understood as meaning that a resistance of 0 ohm exists. If the switch is implemented by a transistor it could well have an on-resistance of several hundred ohms in the closed state. However, this value is much smaller than the resistance of the current source or of a very high-ohm emitter resistor and, for simplicity, can therefore be termed "short-circuit".

When the switch 24 is opened again, i.e. the connection is broken again, an output voltage can build up again at the emitter 10c of the transistor 10 as the load capacitance $C_L$ 22 is charged up.

This charging is dynamically amplified since the transistor 10 is biased into conduction. If the simple case is considered in which the output voltage $U_a$ is discharged to ground when the switch 24 is actuated and a certain input voltage $U_e$ is applied, the emitter voltage will initially be 0 V. Consequently there is a large base-emitter voltage and the transistor permits a large current to flow from the collector terminal 10b to the emitter terminal 10c and this charges up the capacitor $C_L$ 22. As the output voltage $U_a$ rises the transistor 10 blocks increasingly since the base-emitter voltage falls continuously until the transistor again reaches the operating point defined by the current source. Through the dynamic effect, however, the capacitor $C_L$ 22 is charged more quickly than is possible through the constant current source 20 alone. Thus it can be seen that the charging of the load capacitance 22 with the aid of the dynamic current amplification is a fast process. At the start of the interval 32 the capacitor $C_L$ is discharged again by briefly closing the switch 24 and is then charged up to the level specified for the information-bearing part of the interval 32. At the start of the interval 34 the capacitor 22 is discharged again and once the switch 24 has been opened it is then charged up to the information-bearing value of the interval 34. In this way, during a non-information-bearing segment at the start of each interval, the capacitor is always set to a start value which guarantees that in essentially every interval the capacitor $C_L$ is charged up to the appropriate discrete signal level. The profile of the control signal of the switch 24, denoted by $\Phi_1$, is shown in FIG. 5 (*e*).

To prevent too large a current flowing from the node 16 to the node 26 via the transistor during the interval in which the switch 24 is closed, which would increase the power loss, the second switch 12 is controlled by a signal denoted by $\Phi_2$ and shown in FIG. 5 (*d*). To ensure that the switch 12 is definitely open when the switch 24 is closed, the open time of the switch 12 is preferably somewhat larger than the close time of the switch 24. The two control signals $\Phi_1$ and $\Phi_2$ for the two switches 24 and 12 are not therefore necessarily completely complementary to each other.

In FIG. 1 the reference potential at the reference node 26 is shown as being the same as the ground potential at the ground node 18. This represents just one alternative. The reference node 26 could equally well be a low-ohm voltage source or a capacitor charged up to the reference potential, so that the capacitor $C_L$ 22 is not discharged to exactly 0 V, i.e. ground, in each interval, but simply to a value which is less than the lowest value to be expected in the time-discrete analog signal. Expressed in numerical terms, a circuit such as that shown in FIG. 1 could have a battery voltage $U_B$ which creates a potential of +5 V to ground. The discrete voltage levels, on the other hand, could be so constituted as to never be less than e.g. 1 V. In this case it is preferable not to always discharge the capacitor to 0 V but just to 1 V. The low-ohm voltage source which determines the reference potential would then be a voltage source which is adjusted to 1 V. This ensures that the output capacitor $C_L$ 22 is not discharged too strongly, so that a subsequent charging, quick though this is, doesn't take more time than necessary. Another point to be noted is that e.g. an amplifier stage fed by the output signal $U_a$ is not driven into saturation by the sharp drops in the output signal $U_a$ and the subsequent charging processes (reference numeral 40 in FIG. 5).

Instead of discharging to below the lowest expected discrete signal level, as shown in FIG. 1, the reference potential could be so chosen that discharging takes place to a voltage level between the highest and lowest expected discrete signal level of the time-discrete analog signal, as e.g. when very many high discrete signal levels are to be expected and only a few low ones. In this case a speed advantage might result since the overwhelming majority of the signal levels are reached very quickly whereas only a few are reached very slowly. From this it can be seen that the reference potential can be varied within certain limits, which depend in part on the time-discrete analog signal being processed. Choosing the reference potential to be smaller than or equal to the lowest expected discrete level of the time-discrete analog signal thus constitutes simply a preferred embodiment of the present invention.

A further possibility is to actuate switch 24 only briefly so that the capacitor cannot discharge completely to the potential actually present at the reference node 26, whereby the reference potential at the emitter 10*c* of the transistor 10 after opening switch 24 again is not the potential at the reference node 26 but is correspondingly higher. The load capacitance $C_L$ 22 is discharged in this case too, but not exactly to the potential at the reference node 26 but to a potential which is correspondingly higher, depending on the time the switch 24 is kept closed.

As an alternative to the embodiment shown in FIG. 1, in which the switch 12 lies between the node 16 and the collector terminal 10*b*, it could be sited between the emitter terminal 10*c* and the output node 19, an arrangement in which the dc current path through the transistor can, as before, be interrupted when the switch 24 is closed, thus keeping the power loss to a low value.

In the following reference is made to FIG. 2, which shows a circuit according to a second embodiment of the present invention. Concerning FIG. 2 and the other figures, it should be noted that parts with the same reference numerals are substantially identical, so that if they have already been described they will not be described again.

In contrast to the circuit shown in FIG. 1, the circuit shown in FIG. 2 does not include an npn bipolar transistor, having instead an n-channel field-effect transistor 10' having a gate terminal 10*a*' as first port, a drain terminal 10*b*' as second port and a source terminal 10*c*' as third port, the field-effect transistor 10' shown in FIG. 2 being of the intrinsically blocking type. Alternatively, an intrinsically conducting type or a junction FET could also be used. In analogy to FIG. 1, where the bipolar transistor is shown as an emitter follower, the field-effect transistor 10' in FIG. 2 is shown in the source-follower configuration. The transistor also has a bulk terminal 10*d*', which is connected to the ground potential 18 in the normal way. The mode of operation of the n-channel source-follower circuit of FIG. 2 is analogous to that already described for FIG. 1.

As an alternative to the embodiment shown in FIG. 2, in which the switch 12 lies between the node 16 and the drain terminal 10*b*', it could be located instead between the source terminal 10*c*' and the output node 19, an arrangement in which the dc current path through the transistor can, as before, be interrupted when the switch 24 is closed, thus keeping the power loss to a low value.

FIG. 3 shows a circuit according to a third embodiment of the present invention, which is complementary to the circuit according to the first embodiment of the present invention shown in FIG. 1 in that a pnp bipolar transistor 10" is used instead of the npn bipolar transistor. In contrast to the circuit shown in FIG. 1, the emitter 10*c*" is now connected not to ground but to the voltage supply potential $U_B$ via the constant current source $I_{DC}$ 20'. On the other hand the collector of the pnp transistor 10", i.e. the port 10*b*", is now connected to ground potential via the switch 12. In addition, since the circuit shown in FIG. 3 is complementary to the circuit shown in FIG. 1, the capacitor is not discharged to ground via the switch 24 as in FIG. 1 but is charged up to a reference potential 26'. This reference potential could be equal to the voltage supply potential or a potential which is greater than or equal to the highest expected discrete signal level of the time-discrete analog signal. Alternatively the reference potential 26' could also be smaller than the highest expected value if, analogously to what has been described previously, only a very few large discrete signal levels occur so that only a short and rarely long charging of the load capacitance $C_L$ 22 is accepted in order to limit the magnitude of the charge which must normally be discharged for smaller discrete signal levels. This has the effect, as described previously, that subsequent amplifier stages, i.e. amplifier stages which are connected in parallel with the load capacitance $C_L$ 22, are not subjected to high peaks which might drive them into saturation.

The reference potential 26' could be supplied either by a reference voltage source which supplies the desired voltage value for the reference potential or by a capacitor charged to such a voltage value, the working of this capacitor becoming increasingly effective the higher its capacitance is compared with the load capacitance $C_L$ 22. Alternatively the reference potential 26' can also be controlled by the switched-on time of the switch 24 in that the switch 24 is closed only very briefly so that the potential to which the positive electrode of the capacitance $C_L$ 22 is charged is less than the potential at the reference node. In this case the potential at the reference node must be so chosen that a desired reference potential is attained, e.g. one that is greater than or equal to the highest expected discrete signal level.

Switch 24 thus enables the capacitance $C_L$ 22 to be charged up very quickly to the reference potential since the current for changing the charge on the capacitor $C_L$ 22 is subject to very little resistance. This avoids slow charging via the load current source 20' or alternatively via a high-ohm emitter resistor. On the other hand a discharging of the capacitance $C_L$ 22 takes place very quickly via the transistor 10" and is even dynamically enhanced since the transistor 10" is biased into conduction when the input voltage $U_e$ is smaller than the output voltage $U_a$. This is the case since the difference between $U_e$ and $U_a$ is directly present as the base-emitter voltage of the transistor 10". If the output voltage $U_a$ is greater than the input voltage $U_e$, this voltage difference is negative, with the result that the pnp transistor 10" supplies a higher collector current. The closer $U_a$ approaches $U_e$ the less the effect becomes. The effect disappears when $U_a$ has "stabilized" to a value equal to the actual discrete voltage level $U_e$. Thus according to the present invention the fast effect is exploited and the slow effect is eliminated or replaced through the switch 24 so that the capacitance $C_L$ is always discharged essentially from a starting value.

As an alternative to the embodiment shown in FIG. 3, where the switch 12 is located between the node 16' and the collector terminal 10b", it could be situated between the emitter terminal 10c" and the output node 19 so as to again interrupt the dc path through the transistor when the switch 24 is in the closed state, thus permitting the power loss to be kept to a low value.

FIG. 4 shows a circuit according to a fourth embodiment of the present invention, which is identical to the circuit of FIG. 3 except that the pnp bipolar transistor 10" is replaced by a p-channel field-effect transistor 10''' whose bulk terminal 10d''' is connected to the voltage supply potential $U_B$ as is customary in circuits of this type. Depending on the technology, the bulk potential can also be connected to the source terminal. Although an intrinsically blocking field-effect transistor is used in FIG. 4, an intrinsically conducting type or a junction FET could also be used instead.

As an alternative to the embodiment shown in FIG. 4, where the switch 12 lies between the node 16' and the drain terminal 10b''', it could also be located between the source terminal 10c''' and the output node 19 so as to again interrupt the dc path through the transistor when the switch 24 is in the closed state, thus permitting the power loss to be kept to a low value.

Although the two switches 12, 24 have been described generally as switches, it should be noted that they are preferably realized in the form of transistors, these being implemented in the same technology as the transistors of the follower stages. The type of transistor is optional.

Figure 6:
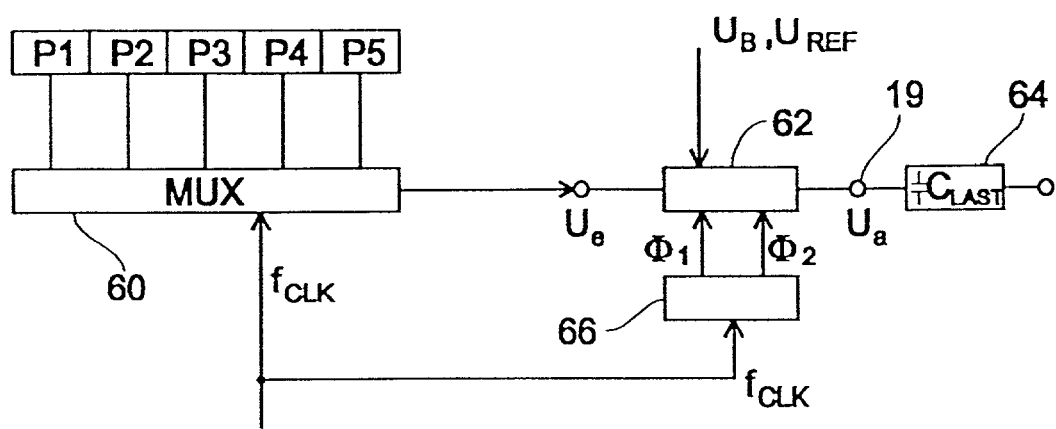
FIG. 6 shows a schematic block diagram of an image sensor according to the present invention with fast analog signal processing.

FIG. 6 shows an application of the circuit according to the present invention which has been described making reference to FIGS. 1 to 5, in an image sensor. The image sensor, which might be a row sensor for a row camera, comprises a plurality of pixel elements P1 to P5. Although only 5 pixel elements are shown in FIG. 6 for the purposes of illustration, it is obvious that the number of pixel elements in a real application is optional and depends on the implementation. For example, 512 or 1024 pixel elements can be used in a row camera. Alternatively an array consisting of a plurality of pixel rows can also be used. However, the number of output lines will generally be smaller than the number of pixel elements, so that the output signals of the individual pixel elements are parallel/serial converted via a multiplexer 60 and are then output on a multiplexer output line. The time-discrete analog signal on the output line of the multiplexer 60 then forms the input signal $U_e$ for the circuit 62 for the fast processing of an analog signal. This circuit, which is simply indicated generally in FIG. 6, has been described in detail in connection with FIGS. 1 to 4.

There will normally be some sort of load capacitance at the output of the circuit 62, either in the form of the input capacitance of a subsequent amplifier stage, or the capacitance of the transmission lines at the output of the circuit 62 or comprising parasitic capacitances. The speed at which the time-discrete analog signals can be output is therefore influenced considerably by the capacitive load on the output of the circuit 62. To preserve a transparent circuit arrangement, an attempt is made to keep the number of output lines from the multiplexer to a minimum. However, in order to be able at the same time to process a large number of pixel elements, i.e. photodiodes or CCD pixels, the readout frequency $f_{CLK}$ must be chosen to be very high. In an embodiment of the present invention this might e.g. be 40 MHz. This means that only 25 ns are available for a single time-discrete analog signal value. An interval is thus only 25 ns long, as a consequence of which the circuit 62 must operate very quickly so as to always alter the charge on the load capacitance $C_L$ 64 to the respective value. The circuit 62 includes an input for the voltage supply potential $U_B$ and for the reference node or the reference potential $U_{REF}$ and is also connected to a time control 66 which, from the clock signal with the frequency $f_{CLK}$, generates clock signals $\Phi_1$ and $\Phi_2$ for controlling the switches 24 and 12 (FIG. 1).

Figure 7:
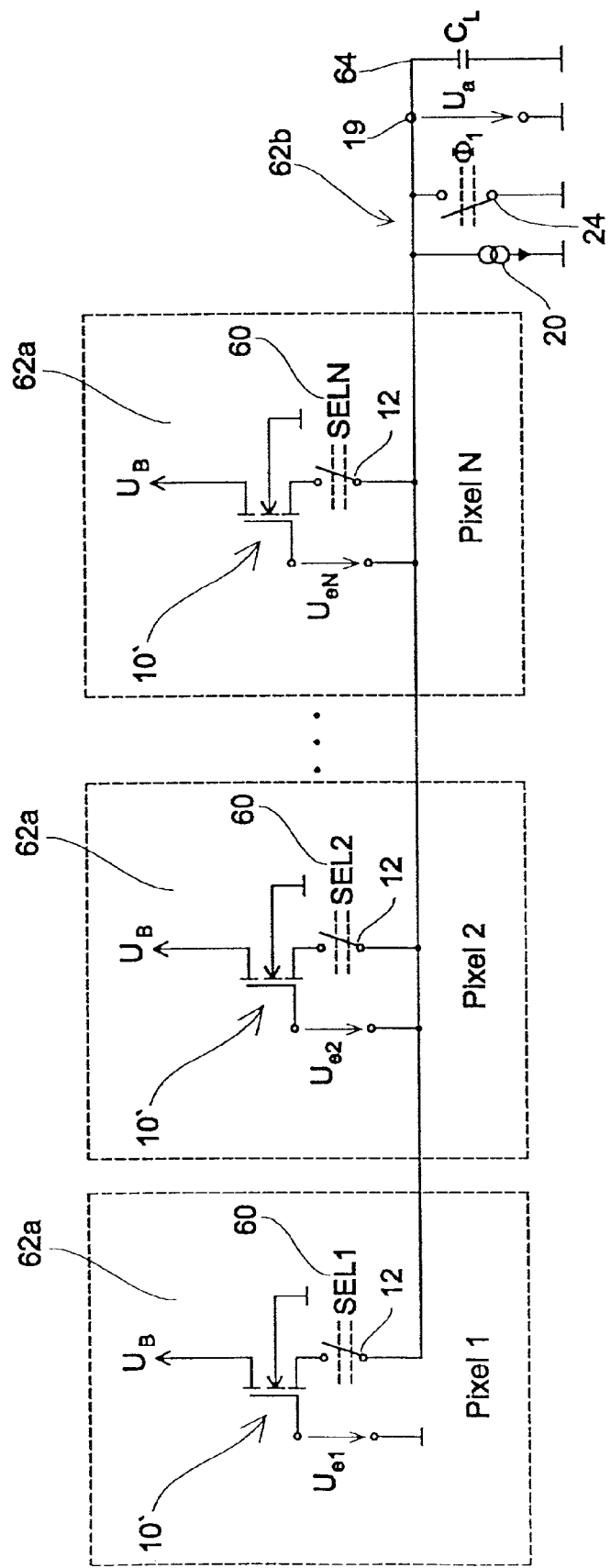
FIG. 7 shows a detailed block diagram of a preferred embodiment for an image sensor from FIG. 6.

FIG. 7 shows a detailed block diagram for a preferred embodiment of an image sensor from FIG. 6. Here the circuit 62 according to the present invention is so structured that a part 62a thereof, i.e. the voltage source 14 and the transistor 10' (FIG. 2), is "multiplexed" onto the individual pixels whereas the other part 62b, i.e. the current source 20, the load capacitance 22 and the switch 24 (FIG. 1), is only present once. Preferably the alternative in which the switches 12 which serve to interrupt the dc path through the transistor when the switch 24 is in the closed state so as to keep down the power loss. These switches, which are also labelled SEL1, SEL2, ..., SELN in FIG. 7, can then also be used for multiplexing as well, as the reference numeral 60 is intended to show. If the pixel with the number 1 is read out, the switch SEL1 will remain closed during readout while the other SELn switches and the switch 24 remain open. Then the switch SELL is also opened and the switch 24 is closed during a non-information-bearing section so as to achieve the effect of resetting to a reference potential in accord with the present invention. Thereafter only the switch SEL2 is closed so as to read out the second pixel with the number 2, and so on. Thus the switches 12 perform a double function, multiplexing on the one hand and on the other interrupting the dc path through the transistors when the switch 24 is in the closed state.

The invention claimed is:

1. A circuit for processing an analog signal having a time sequence of discrete signal levels, each discrete signal level lying in a time interval and representing an information-bearing segment of the interval, the rest of the interval being a non-information-bearing segment, comprising:

a transistor with a first; a second and a third terminal, where the transistor is so arranged that the current flow between the second and the third terminal can be controlled by a signal at the first terminal, that the time-discrete analog signal can be applied to the first terminal and that the third terminal can be coupled to an output node of the circuit;

a device for applying a voltage between a first node with a first potential and a second node with a second potential where the first node can be coupled to the second terminal of the transistor;

a device for supplying a dc current between two terminals, where one terminal is connected to the output node and the other terminal is connected to the second node;

a first switch which is normally open and which can be controlled so that, in the closed state, it connects the output node to a reference node during at least part of the non-information-bearing segment of the interval so as to create a reference potential at the output node of the circuit; and a second switch which is located between the second terminal of the transistor and the first node and which can be controlled so as to interrupt an electrically conductive connection between the first node and the second terminal of the transistor for at least as long as the first switch connects the third terminal of the transistor with the reference node;

wherein the reference node is a terminal of a capacitor which is charged up in order to create the reference potential.

2. A circuit according to claim 1, wherein the reference node is connected to the second node in an electrically conductive manner in such a way that the potential at the reference node is equal to the potential at the second node.

3. A circuit according to claim 1, wherein the reference node is a terminal of a voltage supply which is distinct from a voltage supply which can be connected to the device for applying a voltage.

4. A circuit according to claim 1, wherein the intervals of the analog signal have a constant length which defines a clock frequency of a clock signal and wherein the first switch can be controlled by a control signal which is derived from the clock signal.

5. A circuit according to claim 1, wherein the device for supplying a dc current is a constant current source with high internal resistance or an ohmic resistance of high value.

6. A circuit according to claim 1, wherein the transistor is an npn transistor, where the first terminal is a base terminal, the second terminal is a collector terminal, and the third terminal is an emitter terminal, and wherein the device for applying a voltage is arranged so as to provide a positive potential at the first node and a ground potential at the second node.

7. A circuit according to claim 6, wherein the first switch is arranged to remain closed at least until the potential at the output node is smaller than or equal to the smallest expected discrete signal level of the analog signal.

8. A circuit according to claim 6, wherein the potential at the reference node is smaller than or equal to the lowest expected discrete signal level of the analog signal, and wherein the switch is arranged to remain closed until the potential at the output node has the potential of the reference node as reference potential.

9. A circuit according to claim 1 which also has a capacitance between the output node of the circuit and the second node.

* * * * *